(12) United States Patent
Chu et al.

(10) Patent No.: US 8,293,614 B2
(45) Date of Patent: Oct. 23, 2012

(54) HIGH PERFORMANCE LDMOS DEVICE HAVING ENHANCED DIELECTRIC STRAIN LAYER

(75) Inventors: Sanford Chu, Singapore (SG); Yisuo Li, Singapore (SG); Guowei Zhang, Singapore (SG); Verma Purakh, Singapore (SG)

(73) Assignee: Globalfoundries Singapore Pte. Ltd., Woodlands (SG)

( * ) Notice: Subject to any disclaimer, the term of this patent is extended or adjusted under 35 U.S.C. 154(b) by 0 days.

(21) Appl. No.: 13/333,118

(22) Filed: Dec. 21, 2011

(65) Prior Publication Data

US 2012/0119293 A1 May 17, 2012

Related U.S. Application Data

(62) Division of application No. 12/134,860, filed on Jun. 6, 2008.

(51) Int. Cl.
*H01L 29/66* (2006.01)
(52) U.S. Cl. .......... 438/342; 257/488; 257/E21.421
(58) Field of Classification Search .......... 257/342, 257/488, E21.421
See application file for complete search history.

(56) References Cited

U.S. PATENT DOCUMENTS

| | | | |
|---|---|---|---|
| 5,406,110 A | 4/1995 | Kwon et al. | |
| 5,501,994 A | 3/1996 | Mei | |
| 5,504,033 A | 4/1996 | Bajor et al. | |
| 6,071,768 A | 6/2000 | Duvvury et al. | |
| 6,211,552 B1 | 4/2001 | Efland et al. | |
| 6,365,932 B1 | 4/2002 | Kouno et al. | |
| 6,424,005 B1 | 7/2002 | Tsai et al. | |
| 6,492,679 B1 * | 12/2002 | Imam et al. | 257/342 |
| 6,787,422 B2 | 9/2004 | Ang et al. | |
| 7,196,393 B2 | 3/2007 | Suzuki et al. | |
| 7,297,582 B2 | 11/2007 | Abadeer et al. | |
| 7,381,451 B1 * | 6/2008 | Lang et al. | 427/569 |
| 7,781,292 B2 | 8/2010 | Gambino et al. | |
| 7,829,945 B2 | 11/2010 | Adkisson et al. | |
| 2007/0018273 A1 | 1/2007 | Miller et al. | |
| 2007/0054464 A1 | 3/2007 | Zhang | |
| 2007/0205489 A1 | 9/2007 | Tilke et al. | |
| 2007/0252731 A1 | 11/2007 | Chung | |
| 2008/0290411 A1 | 11/2008 | Lee | |

(Continued)

OTHER PUBLICATIONS

Mohta and Thompson, "Mobility Enhancement The Next Vector to Extend Moore's Law", IEEE Circuits & Devices Magazine, Sep./Oct. 2005.

(Continued)

*Primary Examiner* — N Drew Richards
*Assistant Examiner* — Grant Withers
(74) *Attorney, Agent, or Firm* — Brinks Hofer Gilson & Lione

(57) ABSTRACT

An LDMOS device includes a substrate having a surface and a gate electrode overlying the surface and defining a channel region in the substrate below the gate electrode. A drain region is spaced apart from the channel region by an isolation region. The isolation region includes a region of high tensile stress and is configured to induce localized stress in the substrate in close proximity to the drain region. The region of high tensile stress in the isolation region can be formed by high-stress silicon oxide or high-stress silicon nitride. In a preferred embodiment, the isolation region is a shallow trench isolation region formed in the substrate intermediate to the gate electrode and the drain region.

10 Claims, 4 Drawing Sheets

U.S. PATENT DOCUMENTS

2009/0283827 A1    11/2009    Pendharkar et al.

OTHER PUBLICATIONS

Ma, et al., "High Frequency Power LDMOS Technologies for Base Station Applications Status, Potential, and Benchmarking", IEEE, 2005.

Kondo, et al., "High Performance RF Power LDMOSFETs for Cellular handsets Formed in Thick-Strained-Si/Relaxed-SiGe Structure", IEEE 2005.

Tilke, et al., "Shallow Trench Isolation for the 45-nm CMOS Node and Geometry Dependence of STI Stress on CMOS Device Performance", IEEE 2007.

Tilke, A.T. "STI Gap-Fill Technology with High Aspect Ratio Process for 45 nm CMOS and beyond." The $17^{th}$ Annual Semi-IEEE Adv. Semi. Man. Conf. May 24, 2006, pp. 71-76.

Arghavani, R. "Strain engineering push to the 32 nm logic technology node." Semiconductor Fabtech $32^{nd}$ ed. 2007.

* cited by examiner

HIGH PERFORMANCE LDMOS DEVICE HAVING ENHANCED DIELECTRIC STRAIN LAYER

This application is a divisional application of U.S. patent application Ser. No. 12/134,860, filed Jun. 6, 2008, the entirety of which is incorporated by reference herein.

TECHNICAL FIELD

The invention relates, generally, to transistors in high-voltage, high-power devices, such as RF amplifiers and, more particularly, to lateral-double-diffused-metal-on-silicon (LDMOS) field effect transistors and methods for their fabrication.

BACKGROUND

Conventional LDMOS devices include a field isolation region underneath an edge of a polysilicon beat electrode. The drain region of the LDMOS device is offset from the gate electrode by the field isolation region. Positioning the field isolation region below the edge of the gate electrode improves device performance by distributing the potential voltage drop and reducing the electric field crowding in the substrate.

Recently, LDMOS devices have been introduced using shallow trench isolation (STI) technology to form the field isolation regions. In general, STI isolation improves the performance of submicron MOS devices, in part, by improving latch-up immunity and providing low junction capacitance. The advantage of employing STI technology in an LDMOS device relates to an ability to reduce the dimensions of the device. For example, high voltage devices are needed to drive the thin film transistors for LCD displays. Although, STI technology has been successfully introduced in submicron integrated circuits, when STI structures are fabricated in LDMOS devices, an undesirable increase in the on-resistance (Ron) is increased. Maintaining a low Ron is important to prevent power loss in an LDMOS device.

In addition to employing STI technology, further device improvements are centered on scaling down both the gate length of the transistor and the off-set distance of the drain region. Also, drain engineering techniques, such as doping level adjustments and the like, are employed. In addition to advanced drain engineering, significant reduction in Ron and improvement in transistor gain have been achieved by fabricating LDMOS devices on a strained silicon layer.

Although the use of STI, drain engineering, and strained silicon technology have operated to provide LDMOS devices having improved performance, additional improvements are necessary to overcome the Ron increase observed in LDMOS devices having STI regions.

BRIEF SUMMARY

In accordance with an embodiment of the invention, LDMOS device includes a substrate having a surface. A gate electrode overlies the surface and a channel region resides in the substrate below the gate electrode. An isolation region and a drain region reside in the substrate, and the drain region is spaced apart at the substrate surface by the isolation region. The isolation region includes a region of high tensile stress and is configured to apply localized stress in a substrate in close proximity to the drain region.

In accordance with another embodiment, a method for fabricating an LDMOS device includes providing a substrate having a surface. An isolation region is formed that includes a region of high tensile stress. A gate electrode is formed overlying the substrate surface and defines a channel region in the substrate below the gate electrode. A drain region is formed in the substrate that is spaced apart from the gate electrode at the substrate surface by the isolation region. The isolation region is configured to apply localized stress in the substrate in close proximity to the drain region.

In yet another embodiment, an LDMOS device includes a high tensile stress isolation region in proximity to a gate electrode of the LDMOS device. A drain region is spaced apart from the gate electrode by the high tensile stress isolation region, such that the isolation region applies localized stress in close proximity to the drain region.

DETAILED DESCRIPTION

In accordance with an aspect of the invention, an LDMOS device is provided in which a high tensile stress isolation region is positioned intermediate to the gate electrode and the drain region of the LDMOS device. The high tensile stress isolation region induces localized stress in the substrate in proximity to the drain region of the LDMOS device. The stress induced in close proximity to the drain region increases the saturation current and transconductance (gm) of the LDMOS device, while reducing the on resistance (Ron) of the device. In a preferred embodiment, the high tensile stress isolation region is a shallow trench isolation (STI) structure that includes a high stress insulating material.

Figure 1:
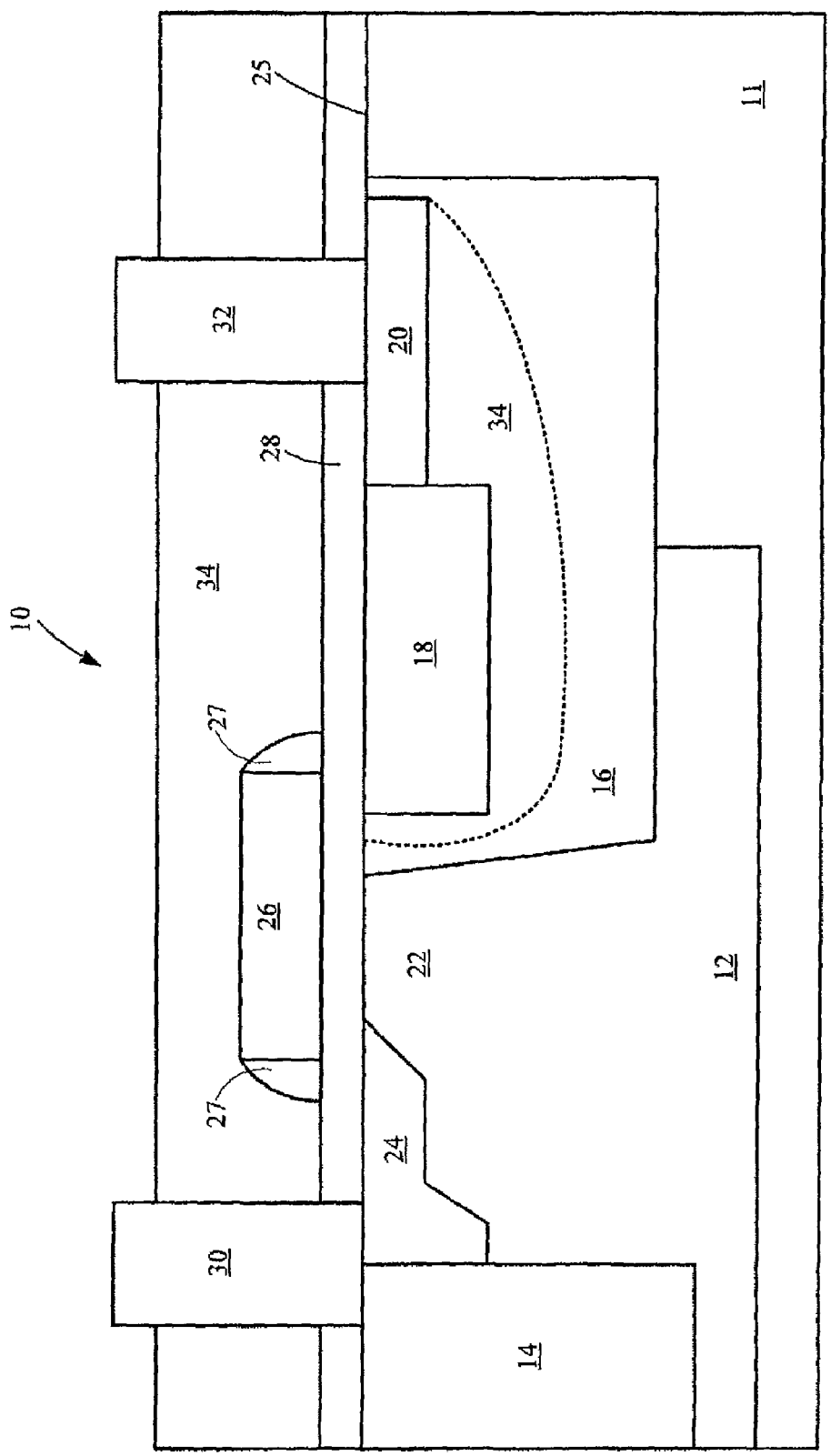
FIG. 1 illustrates, in cross-section, an LDMOS device including a high tensile stress isolation region formed in accordance with the embodiment of the invention.

An exemplary embodiment of a LDMOS device 10 arranged in accordance with an embodiment of the invention is illustrated in FIG. 1. A semiconductor substrate 11 includes a well region 12 and doped regions 14 and 16. A high tensile stress isolation region 18 is formed in semiconductor substrate 10 and separates a drain region 20 from a channel region 22 at principal surface 24 of substrate 11. A source region 24 resides in well region 12 opposite channel region 22 from isolation region 18. A gate electrode 26 overlays channel region 22 and is separated therefrom by a gate dielectric layer 28. Electrical contacts 30 and 32 reside in openings within an overlaying insulating layer 34 and make electrical contact to source region 24 and drain region 20, respectively.

Those skilled in the art will recognize the general features of LDMOS device 10 as the primary functional components of an LDMOS device commonly used for applications such as RF power transistors, and the like. In one embodiment, well region 12 and first doped region 14 have p-type conductivity, while second doped region 16, drain region 20, and source region 24 have an n-type conductivity. Those skilled in the art will appreciate that the conductivity type of the substrate regions and the source and drain regions illustrated in FIG. 1 can be reversed to form a device having an alternate conductivity type. In accordance with the invention, either an n-type or a p-type LDMOS device can be fabricated with the high tensile stress isolation 18 region illustrated in FIG. 1.

Isolation region 18 is configured to induce stress in a region of substrate 11 in close proximity to drain region 20. Accordingly, a high stress region 34 is induced in substrate 11 by application of tensile forces exerted by isolation region 18. Although high stress region 34 is depicted as having a generally uniform geometry and extending a particular distance into substrate 11, the profile of high stress region 34 in substrate 11 will vary depending upon the particular geometry of isolation region 18 and the particular materials used to form isolation region 18. Further, although isolation region 18 is preferably an STI region, isolation 18 can be a different type of isolation region. For example, isolation region 18 can have a conventional isolation geometry formed by a localized-oxidation-of-silicon (LOCOS) process.

In accordance with an aspect of the invention, the stress induced by drain region 18 is sufficient to reduce Ron, while not substantially affecting the breakdown voltage of drain region 20. Accordingly, drain region 20 can be formed with a conventional doping level that enables a sufficiently high breakdown voltage and drain resistance for optimal operation of LDMOS device 10.

In accordance with an embodiment of the invention, high tensile stress isolation region 18 is formed by depositing silicon oxide into a trench formed in principal surface 23 of substrate 11. Preferably a plasma deposition process is used to form the silicon oxide. In one embodiment, the plasma process is a sub-atmospheric chemical-vapor-deposition (SACVD) process employing tetraorthosilane (TEOS) and ozone ($O_3$). Preferably a high-aspect-ratio-process (HARP) is carried out in an SACVD apparatus to form a high stress silicon oxide within the trench. During the deposition process a nucleation layer is formed within the trench using a high $O_3$/TEOS flow rate ratio. For example, in a preferred process the flow rate ratio of $O_3$ to TEOS is about 20:1, As the process continues, the TEOS flow rate is increased and successive layers of silicon oxide are formed on the nuclearation layer. The HARP process is completed with a relatively high TEOS flow rate to completely fill the trench with high stress silicon oxide.

Figure 2:
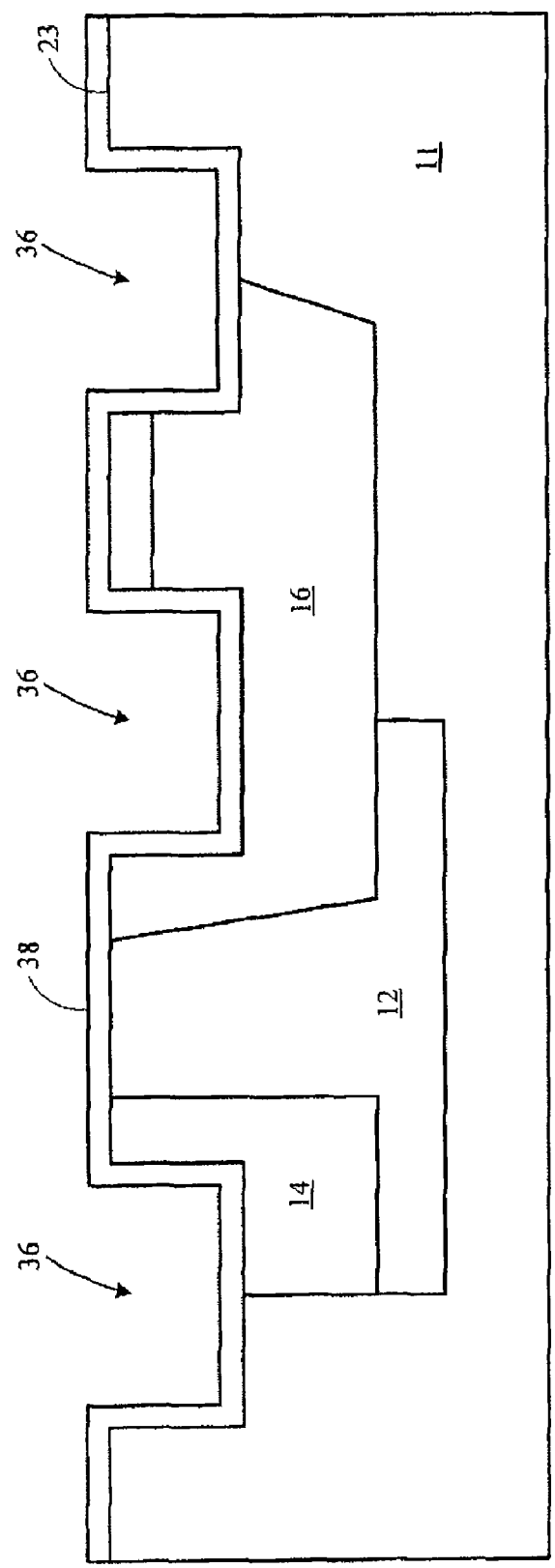
FIGS. 2 and 3 illustrate, and cross-section, processing steps in accordance with the invention.

In an alternative embodiment for fabricating high tensile stress isolation region 18, semiconductor substrate 11 is subjected to ion implementation and annealing processes to form well region 12 and first and second dope regions 14 and 16. As illustrated in FIG. 2, once the well region and dope regions are formed, trenches 36 are formed in surface 23 of substrate 11. Then, a liner material 38 is formed on principal surface 23 and within trenches 36. Preferably, liner material 38 is a silicon oxide layer deposited onto substrate 11 or thermally grown on surface 23.

Figure 3:
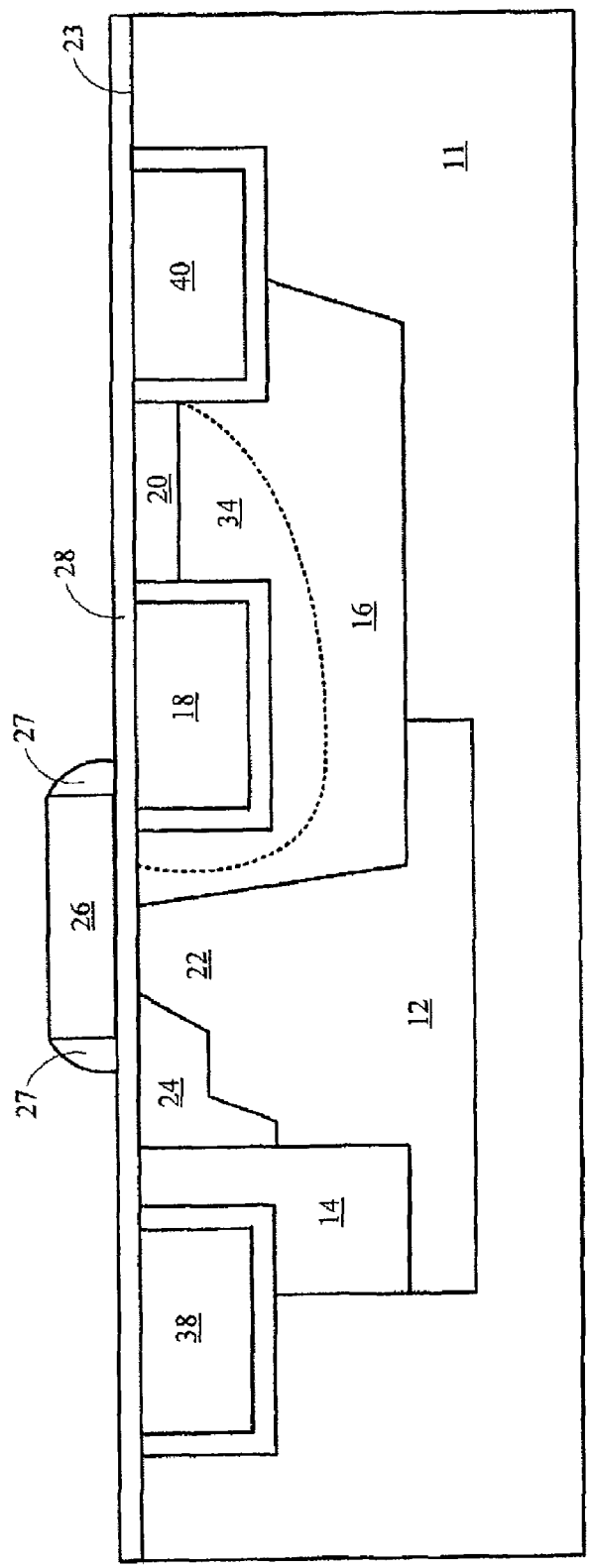

Next, a high stress silicon nitride material is deposited into trenches 32, followed by a planerization process to form a smooth surface. An oxidation process is performed to form dielectric layer 28 on principal surface 23, as illustrated in FIG. 3. The liner and deposition process can also be used to form isolation regions 38 and 40 in semiconductor substrate 11. Alternatively, form isolation regions 38 and 40 can be formed by a conventional STI process.

In similarity to the preceding embodiment, the high stress silicon nitrate within isolation region 18 induces high stress region 34 in substrate 11. High stress region 34 resides in close proximity to drain region 20. Regardless of the particular fabrication method, in accordance with a preferred embodiment of the invention, isolation region 18 is spaced apart from channel region 22 by a distance sufficient to substantially avoid inducing stress in channel region 22.

Figure 4:
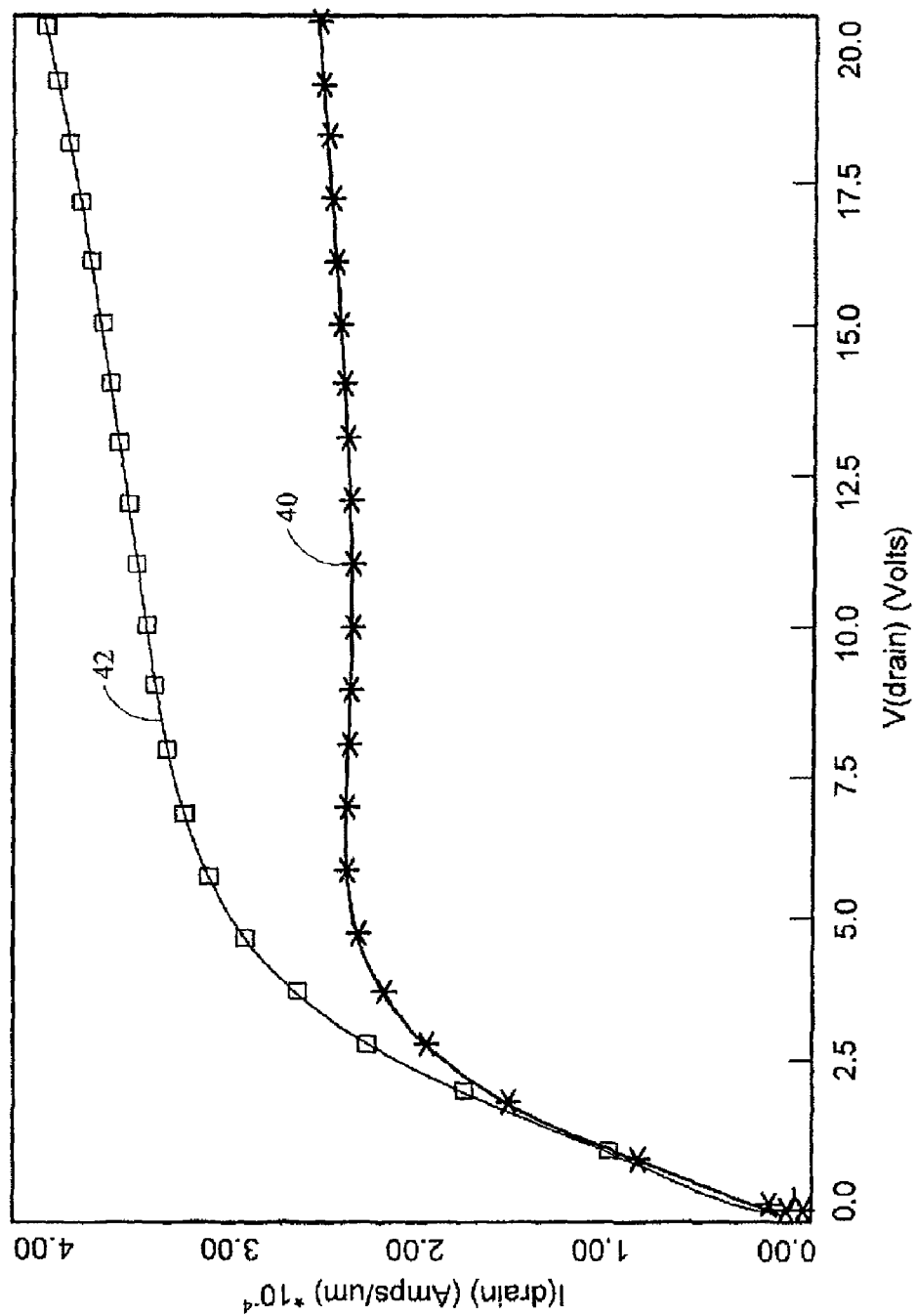
FIG. 4 is a comparative plot of drain current vs. drain voltage for an LDMOS device arranged and fabricated in accordance with the invention and for an LDMOS device according to the prior art.

Shown in FIG. 4 is a comparison plot of drain current versus drain voltage illustrating the current voltage characteristics for a device fabricated in accordance with the invention and for a device fabricated in accordance with the prior art. In FIG. 4, line 40 shows the drain current at various drain voltages for a device fabricated in accordance with the prior art, while line 42 shows the drain current at various drain voltages for a device fabricated in accordance with the invention. The current voltage plots are generated by computer simulations in which the drain source breakdown voltage was set to the same value, and the gate voltage was set to 3.3 volts.

As shown in the plot, the saturation current for an LDMOS device fabricated in accordance with the invention line 42, is considerably higher than the corresponding prior art device, line 40. Further, the Ron of the device fabricated in accordance with the invention was about 12% below that of the corresponding prior art device. Further, the saturation current was about 1.502 times that of the prior art device. Accordingly, as indicated by the test results, a LDMOS device that includes a high-tensile stress isolation region provides a device having reduced Ron and a higher saturation current as compared with an LDMOS device of the prior art. Further, where the localized strain is induced by an STI isolation region, LDMOS devices fabricated in accordance with the invention can be directly integrated into existing semiconductor device fabrication processes for devices having minimum feature sizes as small as about 45 nm. Accordingly, LDMOS devices arranged in accordance with the invention can be included in advanced n and p channel metal-oxide-semiconductor (MOS) and complementary-MOS (CMOS) processes for fabricating a wide variety of semiconductor devices.

In accordance with the invention there has been described a high performance LDMOS device having enhanced dielectric string layer that fully provides the advantages set forth above. Although the invention has been described and illustrated with reference to specific illustrative embodiments thereof, it is not intended that the invention be limited to those illustrative embodiments. Those skilled in the art will recognize that variations and modifications can be without departing from the spirit of the invention. For example, various types of electrical isolation can be included in the LDMOS device. Further, other materials capable of inducing strain in the surrounding substrate can be introduced in the stress-generating isolation region. It is therefore intended to include within the invention also its variations and modifications that fall within the scope of the appended claims and equivalence thereof.

The invention claimed is:

1. An LDMOS device comprising:
 a substrate having a surface;
 a gate electrode overlying the surface and a channel region in the substrate below the gate electrode;
 an isolation region; and
 a drain region in the substrate and spaced apart from the gate electrode at the surface by the isolation region, the isolation region comprising a region of high tensile stress relative to the substrate,
 wherein the isolation region creates a localized stress in a region of the substrate at least partially surrounding the drain region and the isolation region and
 wherein the isolation region is spaced apart from the channel region by a distance to substantially avoid inducing stress in the channel region.

2. The device of claim 1, wherein the isolation region comprises a shallow trench isolation region.

3. The device of claim 2, wherein the shallow trench isolation region comprises a high-stress silicon nitride region separated from the shallow trench by a silicon oxide liner.

4. The device of claim 2, wherein the shallow trench isolation region comprises a plasma deposited silicon oxide within the shallow trench.

5. The device of claim 1, wherein the isolation region is configured to apply localized tensile stress.

6. The device of claim 1, wherein the isolation region is spaced apart from the channel region by a distance sufficient to substantially avoid applying stress to the channel region.

7. An LDMOS device in a substrate, the device comprising an isolation region of high tensile stress relative to the substrate, the isolation region in proximity to a gate electrode of the LDMOS device and a drain region spaced apart from the gate electrode by the high tensile stress isolation region, such that the isolation region creates localized stress in a region of the substrate at least partially surrounding the drain region and the isolation region, and wherein the isolation region is spaced apart from a channel region underlying the gate electrode by a distance to substantially avoid inducing stress in the channel region.

8. The device of claim 7, wherein the isolation region comprises a shallow trench isolation region.

9. The device of claim 8, wherein the shallow trench isolation region comprises a high-stress silicon nitride region separated from the shallow trench by a silicon oxide liner.

10. The device of claim 8, wherein the shallow trench isolation region comprises a plasma-deposited silicon oxide within the shallow trench comprising.

\* \* \* \* \*